United States Patent
Jeng et al.

(10) Patent No.: US 7,169,019 B2
(45) Date of Patent: Jan. 30, 2007

(54) METHOD OF MONITORING SURFACE STATUS AND LIFE OF PAD BY DETECTING TEMPERATURE OF POLISHING INTERFACE DURING CHEMICAL MECHANICAL PROCESS

(75) Inventors: Yeau-Ren Jeng, Tainan (TW); Pay-Yau Huang, Taipei (TW)

(73) Assignee: National Chung Cheng University, Min-Hsiung Township, Chia-Yi County (TW)

( * ) Notice: Subject to any disclaimer, the term of this patent is extended or adjusted under 35 U.S.C. 154(b) by 0 days.

(21) Appl. No.: 11/228,219

(22) Filed: Sep. 19, 2005

(65) Prior Publication Data

US 2006/0252352 A1   Nov. 9, 2006

(51) Int. Cl.
   *B24B 1/00* (2006.01)
(52) U.S. Cl. ............................... 451/8; 451/56
(58) Field of Classification Search ............ 451/1, 451/7, 8, 21, 54, 56, 60
   See application file for complete search history.

(56) References Cited

U.S. PATENT DOCUMENTS

| | | | |
|---|---|---|---|
| 6,645,052 B2 * | 11/2003 | Jensen et al. | 451/41 |
| 2001/0053660 A1 * | 12/2001 | Koinkar et al. | 451/56 |
| 2005/0051267 A1 * | 3/2005 | Elledge | 156/345.12 |
| 2005/0118839 A1 * | 6/2005 | Chen | 438/795 |

* cited by examiner

Primary Examiner—Jacob K. Ackun, Jr.
(74) Attorney, Agent, or Firm—Bacon & Thomas, PLLC

(57) ABSTRACT

A method of monitoring surface status and life of a pad by detecting temperature of a polishing interface during a CMP process. The method include the steps of preparing and placing a brand-new pad under an artificially controlled environment for several CMP tests until termination of its operational life to conclude a relationship between the last stable temperature-rise at a polishing trace during the CMP process and surface roughness of the pad. Then conducting a polishing test of a subject pad under an artificially controlled environment to conclude a relationship between the last stable temperature-rise at a polishing trace during the CMP process and surface roughness of the subject pad. Comparing the two relationships indicated in the aforesaid two steps for analysis to monitor the surface status and operational life of the subject pad.

8 Claims, 2 Drawing Sheets

C. Prepare and place a brand-new pad under an artificially controlled environment for several CMP tests until its operational life is terminated. Then detect temperature to conclude a relationship between the last stable temperature-rise at a polishing trace during the CMP process and surface roughness of the pad.

B. Conduct a polishing test of a subject pad under an artificially controlled environment to conclude a relationship between the last stable temperature-rise at a polishing trace during the CMP process and surface roughness of the subject pad.

A. Compare the two relationships indicated in the steps (A) and (B) for analysis to monitor the surface status and operational life of the subject pad.

FIG. 1

METHOD OF MONITORING SURFACE STATUS AND LIFE OF PAD BY DETECTING TEMPERATURE OF POLISHING INTERFACE DURING CHEMICAL MECHANICAL PROCESS

BACKGROUND OF THE INVENTION

1. Field of the Invention

The present invention relates generally to chemical mechanical polishing (CMP) technology, and more particularly, to a method of monitoring surface status and life of a pad by detecting temperature of a polishing interface during a CMP process.

2. Description of the Related Art

During the CMP process, abrasive slurry and pad are the primary expendable materials in direct connection with the manufacturing efficiency and yield. Although the abrasive slurry is non-reusable to cause no problem of operational life, the pad is frequently reusable during the CMP process to cause the problem of operational life. One pad may be used for polishing multiple wafers and then be reconditioned at its surface based on the surface status to remove residual chippings produced on surfaces of the wafers or residual abrasive particles from the surface of the pad. The pad is subject to gradual wear on its surface during the operation and recondition to reduce roughness of the surface and will be deserted while fully non-reusable.

As indicated above, the surface status and life of the pad is critical to the outcome of the CMP process. As currently on production line, the conventional method of monitoring the operational life of the pad is based on the experience of practical operation or the operational life provided by the supplier of the pad. However, the surface statuses of the pads during the CMP processes are not quite the same, such that there is a high probability that the pad is still reusable but deserted to cause operational waste or the abrasive is fully non-reusable but still reused to cause damage to the surface of the wafer, incurring resource waste and increasing cost.

SUMMARY OF THE INVENTION

The primary objective of the present invention is to provide a method of monitoring surface status and life of a pad by detecting temperature of a polishing interface during a CMP process. The method is based on a relationship between surface condition and temperature-rise of the pad to monitor the operational life of the pad.

The foregoing objective of the present invention is attained by the method, which includes the following steps.

(A) Prepare and place a brand-new pad under an artificially controlled environment for several CMP tests until its operational life is terminated. Then detect temperature to conclude a relationship between the last stable temperature-rise at a polishing trace during the CMP process and surface roughness of the pad.

(B) Conduct a polishing test of a subject pad under an artificially controlled environment to conclude a relationship between the last stable temperature-rise at a polishing trace during the CMP process and surface roughness of the subject pad.

(C) Compare the two relationships indicated in the steps (A) and (B) for analysis to monitor the surface status and operational life of the subject pad.

After the above-mentioned steps, the surface status and life of the subject pad can be monitored based on the analysis of temperature detected between the pad and a workpiece under polishing.

BRIEF DESCRIPTION OF THE DRAWINGS

FIG. 1 is a flow diagram of a preferred embodiment of the present invention.

DETAILED DESCRIPTION OF PREFERRED EMBODIMENTS

Figure 2:
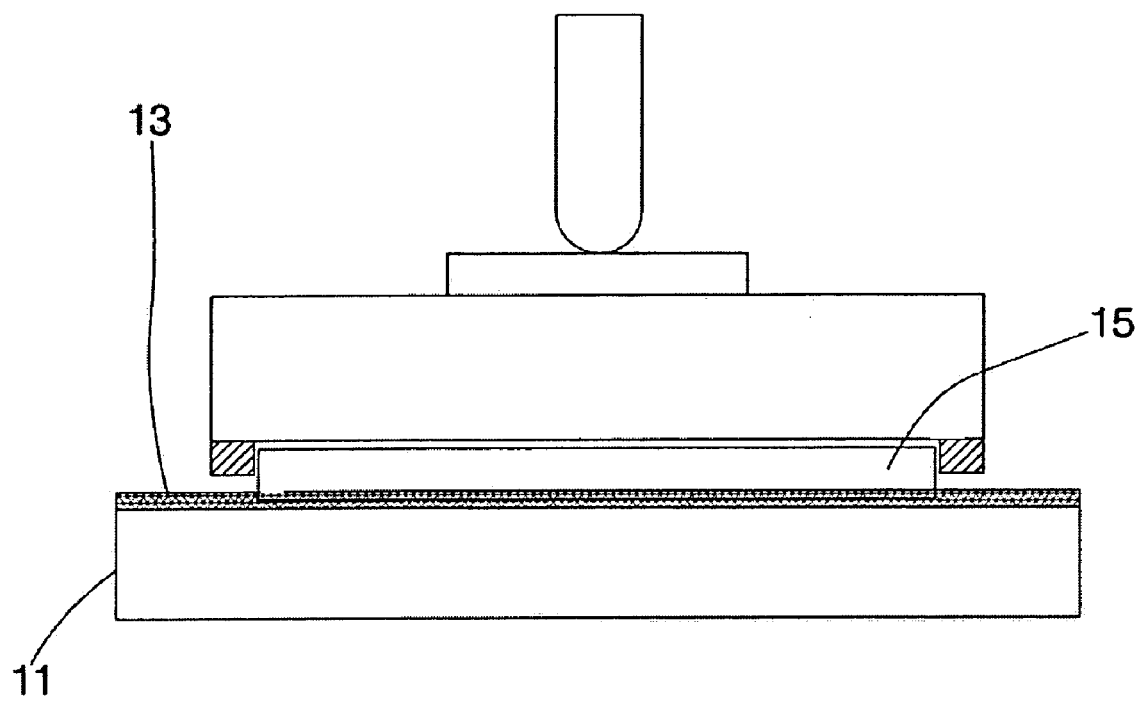
FIG. 2 is a schematic view of the preferred embodiment of the present invention in operation.

Referring to FIG. 1, a method of monitoring surface status and life of a pad by detecting temperature of a polishing interface during a CMP process, according to a preferred embodiment of the present invention, includes the follow steps recited as below.

(A) Prepare and place a brand-new pad 11 together with abrasive slurry 13, as shown in FIG. 2, under an artificially controlled environment for several CMP tests until termination of its operational life and then detect temperature to conclude a relationship between the last stable temperature-rise at a polishing trace during the CMP process and surface roughness of the pad. The aforesaid termination of the operational life is defined by that surface roughness of the pad 11 is non-reusable under wear or by that the CMP process results in an outcome that fails to meet the requirement of the process. Further, the aforesaid artificially controlled environment is defined by conducting a CMP process of a pattern-free or plating-free flat wafer 15 under temperatures of an operational environment and the abrasive slurry 13 both at 20 degrees Celsius (20° C.). The last stable temperature-rise at the polishing trace during the CMP process is defined by that a variation of temperature detected within 5 minutes of the CMP process is not greater than 2° C. While detecting the temperature, it can be done by an infrared thermometer, an infrared thermo imaging camera, or an thermocouple and at a position right behind a contact face between the pad and the wafer for a distance of 0.5–3.0 cm. The surface roughness of the pad 11 can be detected by a roughness meter or an electron microscope.

(B) Conduct a polishing test of a subject pad under an artificially controlled environment to conclude a relationship between the last stable temperature-rise at a polishing trace during the CMP process and surface roughness of the subject pad. The subject pad and the brand-new pad 11 belong to the same type.

(C) Compare the two relationships indicated in the steps (A) and (B) for analysis to monitor the surface status and operational life of the subject pad.

After the above-mentioned steps, the relationship between the surface roughness of the pad and the temperature-rise of the polishing can be concluded. While intending to monitor the operational life of one of the same type of the pads, the user merely conducts the test of the subject pad as indicated in the step (B) and then compares the two relationships for analysis to monitor the surface roughness and operational life of the subject pad.

In conclusion, the present invention allows the user to monitor or estimate the operational life of the pad to predetermine when to replace the pad to avoid the waste of expendable materials, thus effectively reducing the production cost and maintaining fine manufacturing yield.

What is claimed is:

1. A method of monitoring surface status and life of a pad by detecting temperature of a polishing interface during a chemical mechanical polishing (CMP) process, comprising steps of:
   (A) preparing and placing a brand-new pad together with an abrasive slurry under an artificially controlled environment for a plurality of CMP tests until termination of an operational life of said pad and then detecting temperature to conclude a relationship between the last stable temperature-rise at a polishing trace during the CMP process and surface roughness of said pad; and
   (B) conducting a polishing test of a subject pad under an artificially controlled environment to conclude a relationship between the last stable temperature-rise at a polishing trace during the CMP process and surface roughness of said subject pad; and
   (C) comparing said two relationships indicated in the steps (A) and (B) for analysis to monitor the surface status and life of said subject pad.

2. The method as defined in claim 1, wherein said pad in the step (A) and said subject pad in the step (B) belong to the same type.

3. The method as defined in claim 1, wherein said termination indicated in the step (A) is defined by that the surface roughness of said brand-new pad is non-reusable under wear or by that the CMP process results in an outcome failing to meet the requirement of the process.

4. The method as defined in claim 1, wherein said artificially controlled environment indicated in the steps (A) and (B) is defined by conducting the CMP process of a pattern-free or plating-free flat wafer under temperatures of an operational environment and said abrasive slurry both at 20° C.

5. The method as defined in claim 1, wherein said last stable temperature-rise at the polishing trace as indicated in the steps (A) and (B) is defined by that a variation of temperature detected within 5 minutes of said CMP process is not greater than 2° C.

6. The method as defined in claim 1, wherein the temperature is detected by an infrared thermometer, an infrared thermo imaging camera, or a thermocouple.

7. The method as defined in claim 1, wherein said temperature-rise is detected at a position right behind a contact face between said pad and said wafer for a distance of 0.5–3.0 cm.

8. The method as defined in claim 1, wherein said surface roughness of said pad is detected by a roughness meter or an electron microscope.

* * * * *